United States Patent
Lee et al.

(10) Patent No.: US 6,731,177 B2
(45) Date of Patent: May 4, 2004

(54) INTERMITTENT OSCILLATION CIRCUIT (75) Inventors: Jeng-Shing Lee, Hsinchu (TW);
Yee-Lu Zhaog, Taoyuan (TW);
Chin-Chung Wen, Changhua (TW)

(73) Assignee: Sino Matrix Technology, Inc., Hsinchu (TW)

( * ) Notice: Subject to any disclaimer, the term of this patent is extended or adjusted under 35 U.S.C. 154(b) by 71 days.

(21) Appl. No.: 10/156,489

(22) Filed: May 28, 2002

(65) Prior Publication Data

US 2003/0222724 A1 Dec. 4, 2003

(51) Int. Cl.$^7$ ................................................ H01L 7/00
(52) U.S. Cl. ................................ 331/36 C; 331/100
(58) Field of Search ........................ 331/36 C, 100, 331/107 R, 108 R, 109, 108 A, 185

(56) References Cited

U.S. PATENT DOCUMENTS

| | | | | |
|---|---|---|---|---|
| 4,328,570 A | * | 5/1982 | Nakagawa | ................ 368/67 |
| 5,907,600 A | * | 5/1999 | Fuller et al. | ........... 379/106.01 |
| 6,025,757 A | * | 2/2000 | Tsukagoshi et al. | ........ 331/158 |
| 6,552,623 B2 | * | 4/2003 | Nishida et al. | ............. 331/111 |

* cited by examiner

Primary Examiner—Timothy P. Callahan
Assistant Examiner—Cassandra Cox
(74) Attorney, Agent, or Firm—Harness, Dickey & Pierce, P.L.C.

(57) ABSTRACT

An intermittent oscillation circuit is disclosed, and more particularly, relates to an intermittent oscillation circuit utilized in a RF transmitting/receiving system. The intermittent oscillation circuit of the present invention comprises an inversion circuit, a power control circuit and a power supply circuit. By utilizing the power control circuit to controlling the operation voltage level outputted from the power supply circuit, the duty cycle of oscillatory signal outputted from the inversion circuit can be adjusted. Therefore, data collision is decreased while transmitting/receiving various data in the RF transmitting/receiving system, and the power consumption is decreased at the transmitting/receiving terminal as well.

7 Claims, 5 Drawing Sheets

INTERMITTENT OSCILLATION CIRCUIT

FIELD OF THE INVENTION

The present invention relates to an intermittent oscillation circuit, and more particularly relates to an intermittent oscillation circuit utilized in a RF transmitting/receiving system. By controlling the duty cycle of an oscillatory signal outputted from the intermittent oscillation circuit, data collision can be decreased while data is transmitted or received, and meanwhile the power consumption can be decreased.

BACKGROUND OF THE INVENTION

Figure 1:
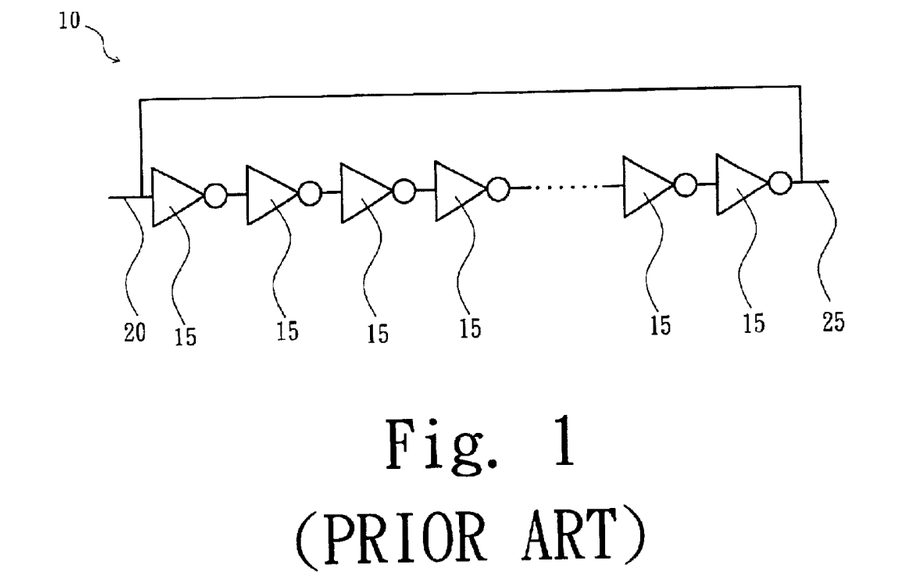
FIG. 1 is a diagram showing a conventional oscillation circuit.
Figure 2:
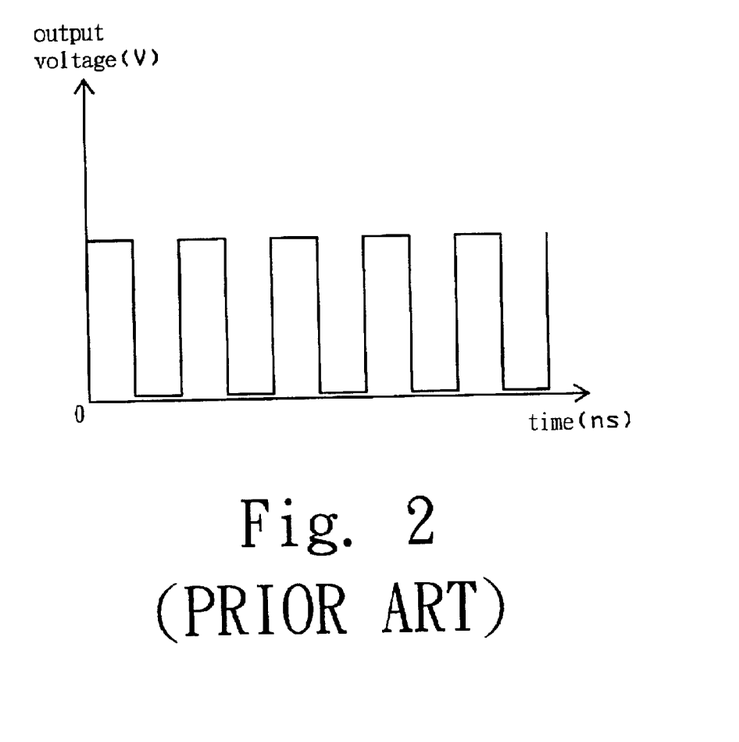
FIG. 2 is a diagram showing the wave form outputted from the oscillation circuit shown in FIG. 1.

Among many communication products, oscillators or oscillation circuits have been widely utilized, wherein a simple oscillation circuit can be constructed by many inverters connected in series. Please referring to FIG. 1, FIG. 1 is a diagram showing a conventional oscillation circuit. As shown in FIG. 1, an oscillation circuit 10 is constructed by certain number of inverters 15 connected in series, and the output terminal 25 of the oscillation circuit 10 is electrically connected to the input terminal 20 of the oscillation circuit 10 for feedbacking an output signal to the input terminal 20, so that oscillatory signals can be continuously outputted from the oscillation circuit 10. Please referring to FIG. 2, FIG. 2 is a diagram showing the wave form outputted from the oscillation circuit shown in FIG. 1.

Figure 3:
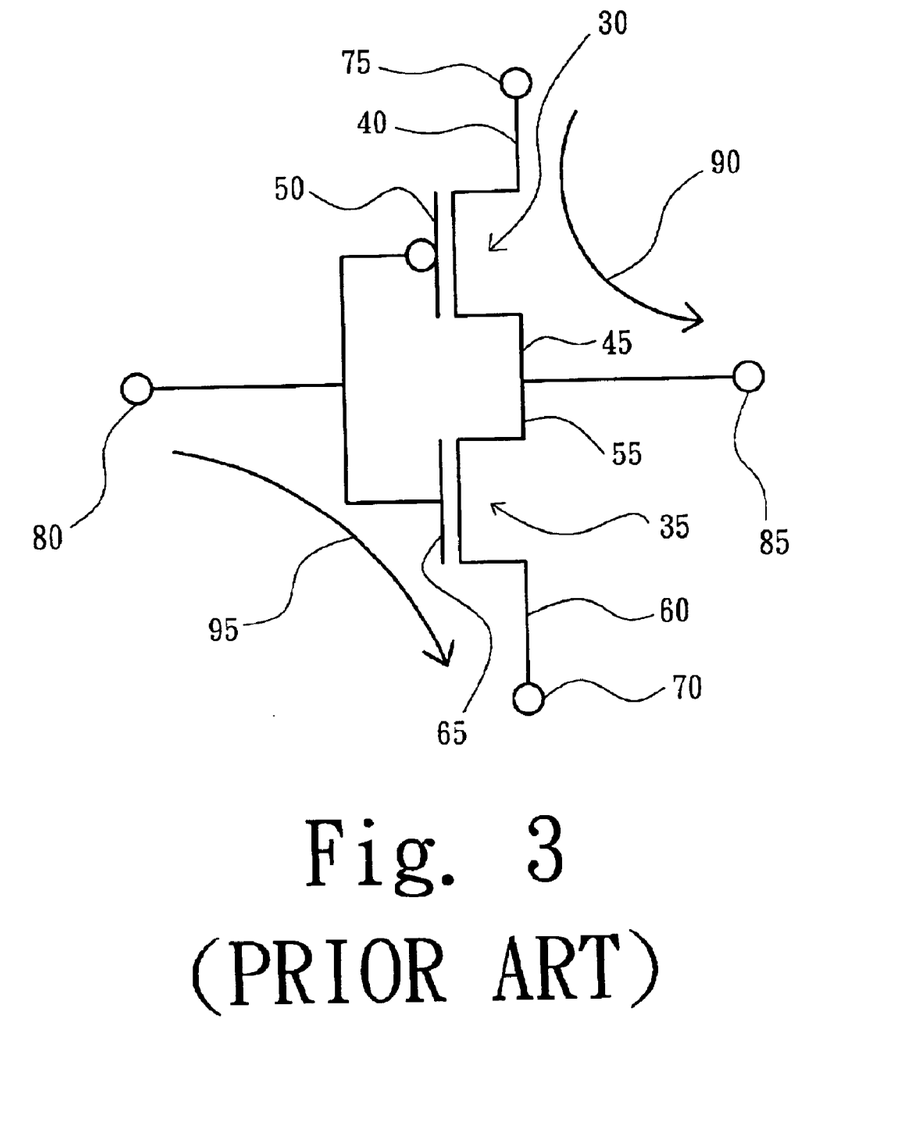
FIG. 3 is a diagram showing a conventional inverter constructed by a PMOS and a NMOS.

About the construction and operation theorem of inverter 15, please refer to FIG. 3 and the following description. FIG. 3 is a diagram showing a conventional inverter constructed by a PMOS and a NMOS. The conventional inverter 15 constructed by a PMOS 30 and a NMOS 35 is shown in FIG. 3, wherein the drain 40 of the PMOS 30 is electrically connected to an operation voltage 75, and the source 60 of the NMOS 35 is electrically connected to a ground 70, and the gate 50 of the PMOS 30 and the gate 65 of the NMOS 35 are electrically connected to an input terminal 80 of the inverter 15, and the source 45 of the PMOS 30 and the drain 55 of the NMOS 35 are electrically connected to an output terminal 85 of the inverter 15.

If an input signal is implemented at the input terminal 80 of the inverter 15, and the voltage level ($V_1$) of the input signal is equal to or smaller than the threshold voltage of the PMOS 30 (i.e. $V_1 \leq V_{t1}$), then the PMOS 30 is activated, but the NMOS 35 is not activated, so that the current from the operation voltage 75 will flow to the output terminal 85 through the PMOS 30, such as shown by the current direction 90 in FIG. 3. Therefore, the inverter 15 outputs a signal with a high voltage level (or called "1" logic signal).

Additionally, if an input signal is implemented at the input terminal 80 of the inverter 15, and the voltage level ($V_1$) of the input signal is equal to or larger than the threshold voltage of the PMOS 30 (i.e. $V_1 \geq V_{t1}$), then the NMOS 35 is activated, but the PMOS 30 is not activated, so that the current from the operation voltage 75 can not flow to the output terminal 85 through the PMOS 30, i.e. the current can flow in the direction as shown by the current direction 90 in FIG. 3. Instead, the current from the input terminal will flow to the ground 70 through the NMOS 35, such as shown by the current direction 95 in FIG. 3. Therefore, the inverter 15 outputs a signal with low voltage level (or called "0" logic signal), therefore completing the inversion process in the inverter 15.

In the conventional RF transmitting/receiving system, the conventional oscillation circuit 10 shown in FIG. 1 is usually utilized in transmitting modules, such as cards or tags, for generating oscillatory signals by which the data saved in the transmitting modules is transmitted by RF to the receiving terminal of the conventional RF transmitting/receiving system. However, if the same oscillation circuit is applied to each of numerous transmitting modules, serious data collisions will happen while those numerous transmitting modules transmit data to the conventional RF transmitting/receiving system at the same time, causing the conventional RF transmitting/receiving system failing to accurately receive the data from each of the transmitting modules, or causing the delay of the data in receiving process, so that the performance and accuracy of data transmission are decreased.

SUMMARY OF THE INVENTION

In view of the background of the invention described above, in the conventional RF transmitting/receiving system, the conventional oscillation circuit utilized in transmitting modules just only generates an oscillatory signal having a fixed duty cycle. While numerous transmitting modules perform data transmission simultaneously, data collision occurs in transmission channels, so that the conventional RF transmitting/receiving can not receive the data from each of the transmitting modules accurately.

It is the principal object of the present invention to provide an intermittent oscillation circuit utilized in a RF transmitting/receiving system, wherein the intermittent oscillation circuit has a function of controlling the duty cycle of outputted oscillatory signal. Therefore, thereby improving the data collision occurring while numerous transmitting modules perform data transmission at the same time, also lowering the power consumption.

In accordance with the aforementioned object of the present invention, the present invention provides an intermittent oscillation circuit comprising: a power supply circuit comprising a current source and a first resistor, wherein one terminal of the current source and one terminal of the first resistor both are electrically connected to ground, and the other terminal of the current source and the other terminal of the first resistor both are electrically connected to an output terminal of the power supply circuit; a power control circuit comprising: a second resistor, a first PMOS and a comparing module, wherein one terminal of the second resistor is electrically connected to the output terminal of the power supply circuit, and the drain of the first PMOS is electrically connected to the other terminal of the second resistor, and the source of the first PMOS is electrically connected to the ground, and the gate of the first PMOS is electrically connected to the output terminal of the comparing module; an inversion circuit comprising: a third resistor, a fourth resistor, a fifth resistor, a first capacitor, a second capacitor and at least one inverter, wherein one terminal of the third resistor, one terminal of the fourth resistor and one terminal of the fifth resistor all are electrically connected to the output terminal of the comparing module, and one terminal of the first capacitor and one terminal of the second capacitor both are electrically connected to the ground, and the other terminal of the second capacitor is electrically connected to the other terminal of the fourth resistor, and the at least one inverter is constructed by a second PMOS and a NMOS, and the source of the NMOS is electrically connected to the ground, and the drain of the second PMOS is electrically connected to the output terminal of the power supply circuit, and the gate of the second PMOS and the gate of the NMOS both are electrically connected to the other terminal of the first capacitor and the other terminal of the fifth resistor, and the source of the second PMOS and the drain of the NMOS both are electrically connected to the other terminal of the third resistor and used as an output terminal of the intermittent oscillation circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 4:
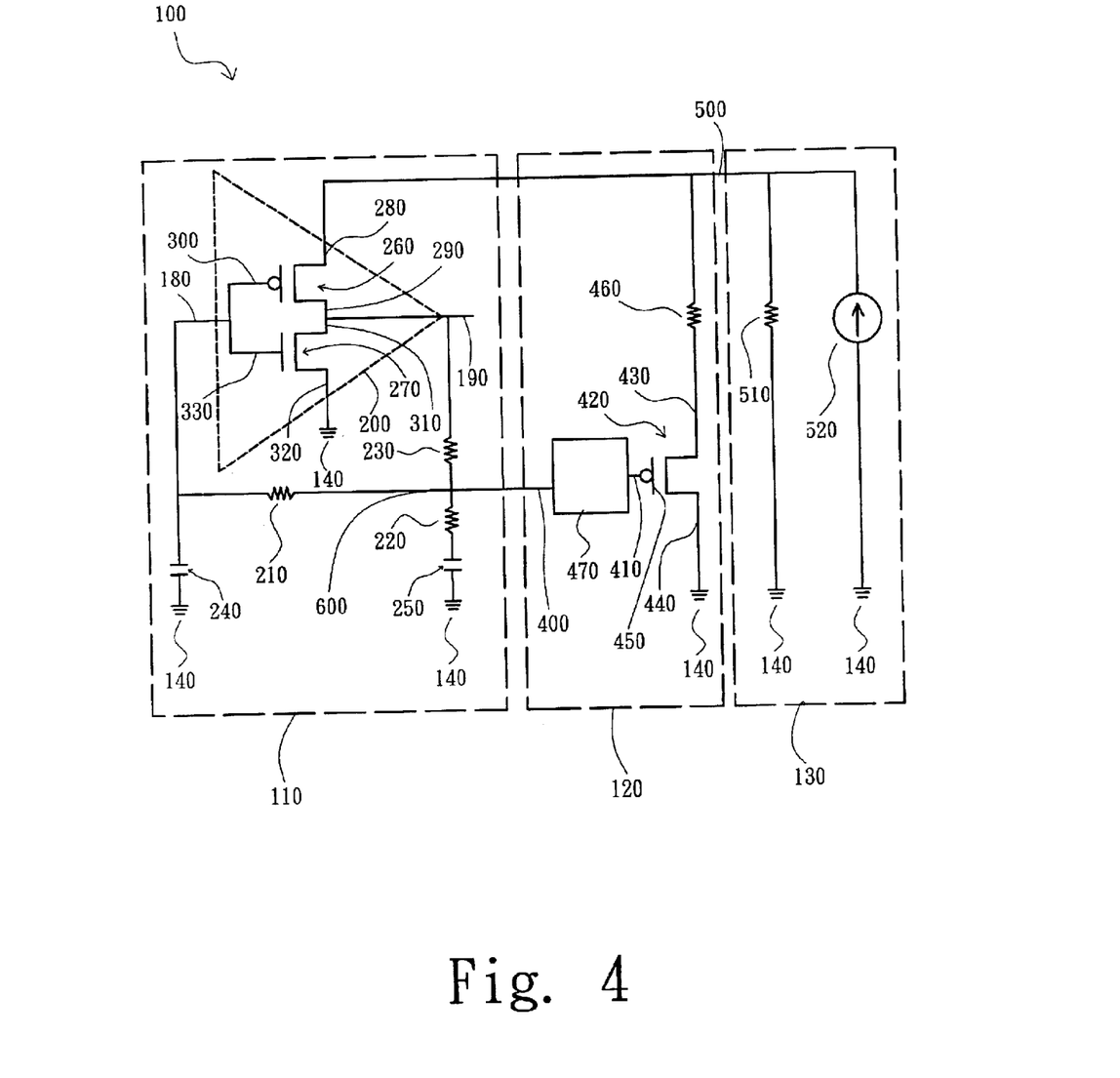
FIG. 4 is a circuit diagram showing a preferred embodiment of the present invention.

Please referring to FIG. 4, FIG. 4 is a circuit diagram showing a preferred embodiment of the present invention. As shown in FIG. 4, the oscillation circuit 100 of the present invention is constructed by an inversion circuit 10, a power control circuit 120 and a power supply circuit 130.

The inversion circuit 110 is constructed by an inverter 200, a resistor ($R_1$) 210, a resistor ($R_2$) 220, a resistor ($R_3$) 230, a capacitor ($C_1$) 240 and a capacitor ($C_2$) 250, wherein the capacitance of the capacitor ($C_2$) is larger than the capacitance of the capacitor ($C_1$) 240. The inverter 200 is constructed by a PMOS 260 and a NMOS 270, wherein the drain 280 of the PMOS 260 is electrically connected to the output terminal 500 of the power supply circuit 130 for obtaining the operation voltage outputted from the power supply circuit 130, and the source 320 of the NMOS 270 is electrically connected to ground 140, and the electrical connection between the gate 300 of the PMOS 260 and the gate 330 of the NMOS 270 is used as the input terminal 180 of the inverter 200, and the electrical connection between the source 290 of the PMOS 260 and the drain 310 of the NMOS 270 is used as the output terminal 190 of the inverter 200, and also as the output terminal of the oscillation circuit 100.

Moreover, one terminal of the capacitor ($C_1$) 240 and one terminal of the capacitor ($C_2$) 250 both are electrically connected to the ground 140, and the other terminal of the capacitor ($C_1$) 240 and one terminal of the resistor ($R_1$) 210 both are electrically connected to the input terminal 180, and the other terminal of the resistor ($R_1$) 210, one terminal of the resistor ($R_2$) 220 and one terminal of the resistor ($R_3$) 230 all are electrically connected to the input terminal 400 of the power control circuit 120, and the other terminal of the resistor ($R_3$) 230 is electrically connected to the output terminal 190 of the inverter 200, and the other terminal of the resistor ($R_2$) 220 is electrically connected to the other terminal of the capacitor ($C_2$) 250.

The power control circuit 120 is constructed by a comparing module 470, a resistor ($R_4$) 460 and a PMOS 420. The input terminal 400 of the comparing module 470 is used as the input terminal of the power control circuit 120, and the output terminal 410 of the comparing module 470 is electrically connected to the gate 450 of the PMOS 420. The source 440 of the PMOS 420 is electrically connected to the ground 140, and the drain 430 of the PMOS is electrically connected to one terminal of the resistor ($R_4$) 460, and the other terminal of the resistor ($R_4$) 460 is electrically connected to the output terminal 500 of the power supply circuit 130.

The power supply circuit 130 is constructed by a current source ($I_s$) 520 and a resistor ($R_5$) 510 as shown in FIG. 4, supplying the operation voltage to the inversion circuit 110 and the power control circuit 120 through the output terminal 500.

When the inversion circuit 100 begins to operate, the power supply circuit 130 outputs an operation voltage to the inversion circuit 110 and the power control circuit 120 through the output terminal 500, and at this time, the capacitor ($C_1$) 240 and the capacitor ($C_2$) 250 do not have any charge stored, so that the voltage is zero at the node 600, i.e. the voltage is zero at the input terminal of the power control circuit 120. By means of predetermining a first threshold voltage, a second threshold voltage and other input/output conditions, the comparing module 470 will output a high voltage level through the output terminal 410 if the voltage at the input terminal 400 is not equal to or larger than the first threshold voltage of the comparing module 470; and a low voltage level through the output terminal 410 if the voltage at the input terminal 400 is equal to or larger than the second threshold voltage of the comparing module 470. If the voltage at the input terminal 400 is between the first threshold voltage and the second threshold voltage, then the voltage level outputted from the comparing module 470 is the same as that previously outputted from the comparing module 470 before. Hence, when the oscillation circuit 100 begins to operate, the comparing module 470 outputs a high voltage level at the output terminal 410 because the voltage at the input terminal of the power control circuit 120 is zero and is less than the first threshold voltage of the comparing module 470. Since the high voltage level outputted from the comparing module 470 is larger than the threshold voltage of the PMOS 420, the PMOS is not activated, so that there is an interruption between the resistor ($R_4$) 460 and the ground 140. Therefore, the operation voltage is equal to the current source ($I_s$) 520 multiplied by the resistor ($R_5$) 510, i.e. $V_{d1}=I_s \times R_5$ (formula 1).

Meanwhile, when the oscillation circuit 100 begins to operate, there is a low voltage level at the input terminal 180 of the inverter 200, and this low voltage level is not larger than the threshold of the NMOS 270, so that the NMOS 270 is not activated, but this low voltage level is less than the threshold voltage of the PMOS 260, so that the PMOS is activated. Therefore, the current from the drain 280 of the PMOS 260 will enter the output terminal 190, and the inversion circuit 110 outputs a high voltage level.

When the high voltage level is outputted from the output terminal 190, the capacitor ($C_2$) 250 will be charged by this high voltage level through the resistor ($R_3$) 230 and the resistor ($R_2$) 220, and the capacitor ($C_1$) 240 will be charged by this high voltage level through the resistor ($R_3$) 230 and the resistor ($R_1$) 210 as well. Since the capacitance of the capacitor ($C_2$) 250 is designed to be much larger than that of the capacitor ($C_1$) 240, so that the rate for increasing the voltage level at the input terminal 180 is faster than that at the node 600. When the voltage at the input terminal 180 is increased to the one larger than the threshold voltage of the NMOS 270, the PMOS 260 will not be activated but the NMOS 270 will be activated, so that the current from the input terminal 180 and the capacitor ($C_2$) 250 will enter the ground 140 through the NMOS 270. Therefore, the inversion circuit 110 outputs a low voltage level, and the oscillation circuit is in an oscillating status and outputs a continuous oscillatory signal.

When the oscillation circuit 100 outputs a low voltage level, the capacitor ($C_2$) 250 will be discharged to the ground 140 through the resistor ($R_2$) 220, the resistor ($R_3$) 230 and the NMOS 270. However, by appropriately designing the resistances of the resistor ($R_1$) 210, the resistor ($R_2$) 220 and the resistor ($R_3$) 230 and the capacitances of the capacitor ($C_1$) 240 and the capacitor ($C_2$) 250, the voltage at the node 600 can be increased whenever the oscillation circuit 100 outputs a low voltage level or a high voltage level. Therefore, the voltage level of the input terminal of the power control circuit 120 (i.e. the input terminal 400 of the comparing module 470) is increased continuously.

Because the first threshold voltage, the second threshold voltage and the input/output conditions of the comparing module 470 have been predetermined, the comparing module 470 will output a low voltage level through the output terminal 410 when the voltage at the input terminal 400 is equal to or larger than the first threshold voltage of the comparing module 470, and moreover, this low voltage level will be less than the threshold voltage of the PMOS 420, so that the PMOS 420 is activated and the resistor ($R_4$) 460 and the ground 140 are short-circuited.

As shown in FIG. 4, since the resistor ($R_4$) 460 and the PMOS 420 are electrically connected in parallel with the current source ($I_s$) 520 and the resistor ($R_5$) 510, when the resistor ($R_4$) 460 and the ground 140 are short-circuited through the PMOS 420, the operation voltage outputted from the power supply circuit 130 is changed to $$V_{d2}=I_s\times((R_5)//(R_4+R_M)) \quad \text{formula (2)}$$

wherein the $R_M$ is the operating resistance of the PMOS 420, and the formula (2) can be written to $$V_{d2}=I_s\times((R_5)\times(R_4+R_M)/((R_5)+(R_4+R_M))) \quad \text{formula (3)}$$

By appropriately designing the resistance of the resistor ($R_4$) 460, the resistor ($R_5$) 510 and the operating resistance of the PMOS 420, the $V_{d2}$ can be made to be far less than the $V_{d1}$.

When the operation voltage is decreased from the $V_{d1}$ in the formula (1) to the $V_{d2}$ in the formula (2), since the drain 280 of the PMOS 260 of the inverter 200 is electrically connected to the output terminal 500 of the power supply circuit 130, the current flowing from the drain 280 to the source 290 of the PMOS 260 is decreased rapidly when the operation voltage is decreased from $V_{d1}$ to $V_{d2}$. Therefore, the PMOS 260 is not activated, and the current from the drain 280 can not flow to the output terminal 190 through the PMOS 260, the voltage outputted from the inversion circuit 110 is decreased from the high level to the low level, and meanwhile, the oscillation in the oscillation circuit 100 is stopped, and the oscillation circuit 100 does not output any oscillatory signal, and is in a stop status.

When the oscillation is stopped, since the capacitor ($C_1$) 240 and the capacitor ($C_2$) 250 have be charged and stored certain charges, the capacitor ($C_1$) 240 can be discharged to increase the voltage at the input terminal 180 of the inverter 200 to the one larger than the threshold voltage of the NMOS 270, and thus the NMOS 270 is activated. Then, the capacitor ($C_1$) 240 is discharged to the ground 140 through the NMOS 270, and the capacitor ($C_2$) 250 is discharged to the ground 140 through the resistor ($R_2$) 220, the resistor ($R_3$) 230 and the NMOS 270, so that the voltage at the node 600 is decreased.

When the voltage at the node 600 (the input terminal 400 of the comparing module 470) is equal to or less than the second threshold voltage of the comparing module 470, the voltage outputted from the comparing module 470 is increased from the low level to the high level, so that the PMOS is off and not activated. Therefore, there is an interruption between the resistor ($R_4$) 460 and the ground 140, and the operation voltage outputted from the power supply circuit 130 is increased from $V_{d2}$ in the formula (3) to $V_{d1}$ in the formula (1).

At this time, the capacitor ($C_1$) 240 and the capacitor ($C_2$) 250 in the inversion circuit 110 have been discharged all the charges stored to the ground 140, so that the input terminal 180 of the inverter 200 has a low voltage level. Therefore, the NMOS 270 is not activated but the PMOS is activated. The current from the drain 280 will enter the output terminal 190 through the PMOS 260, so that the inversion circuit 110 outputs a high voltage level. Meanwhile, the capacitor ($C_1$) 240 is charged by this high voltage level through the resistor ($R_3$) 230 and the resistor ($R_1$) 210, and the capacitor ($C_2$) 250 is also charged by this high voltage level through the resistor ($R_3$) 230 and the resistor ($R_2$) 220.

Figure 5A:
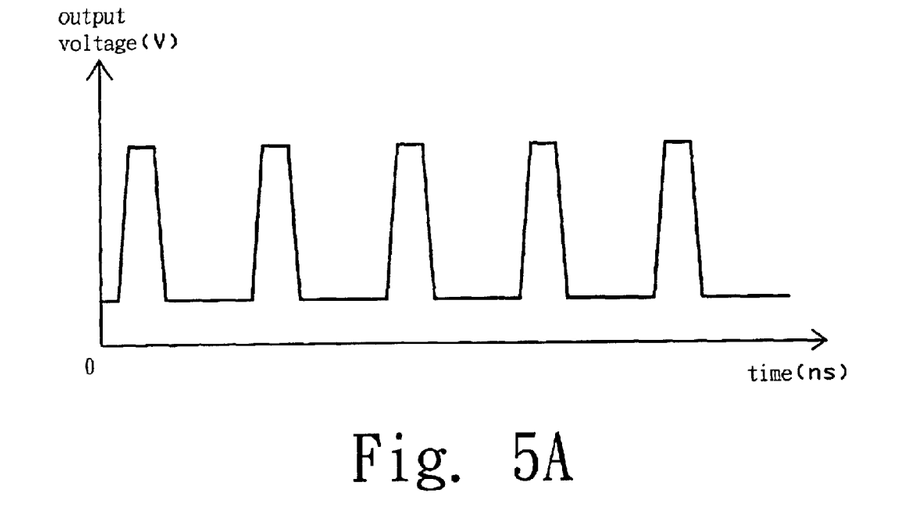
FIG. 5A and FIG. 5B are diagrams showing the wave forms of the oscillatory signals outputted from the preferred embodiment of the present invention according to FIG. 4.
Figure 5B:
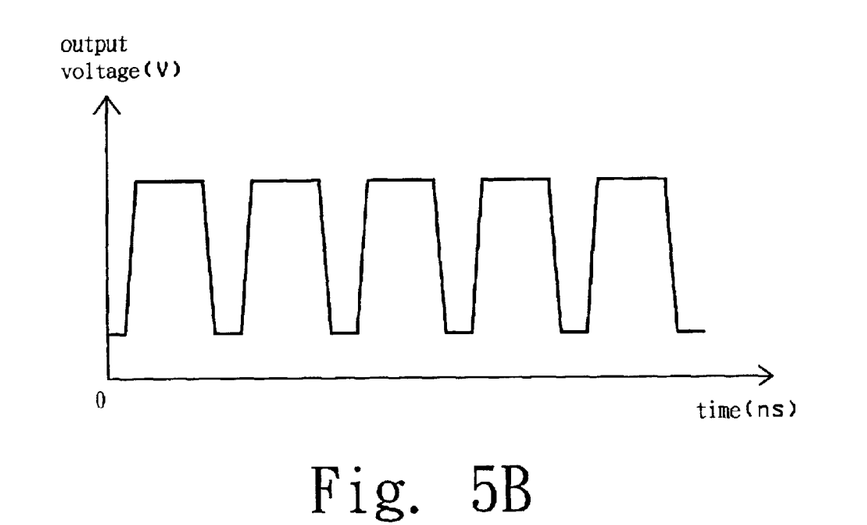

Since the capacitance of the capacitor ($C_2$) 250 is larger that of the capacitor ($C_1$) 240, the voltage at the input terminal 180 of the inverter 200 is increased rapidly to the threshold voltage of the NMOS 270, so that the PMOS 260 is not activated but the NMOS 270 is activated, and the current from the input terminal 180 and the current from the capacitor ($C_2$) 250 will flow from the NMOS 270 to the ground 140, and the inversion circuit 110 outputs a low voltage level. Therefore, the oscillation circuit 100 enters the oscillation status and outputs oscillatory signal continuously. About the wave form of oscillatory signal outputted from the oscillation circuit 100, please refer to FIG. 5A and FIG. 5B, wherein FIG. 5A and FIG. 5B are diagrams showing the wave forms of the oscillatory signals outputted from the preferred embodiment of the present invention according to FIG. 4.

In conclusion, by appropriately designing the capacitances of the capacitor ($C_1$) 240 and the capacitor ($C_2$) 250, and the resistance of the resistor ($R_4$) 460 and the first threshold voltage, the second threshold voltage and other input/output condition of the comparing module 470, the duty cycle of oscillatory signal outputted from the oscillation circuit 100 can be adjusted and controlled simply. Therefore, if the intermittent oscillation circuit of the present invention is utilized in transmitting modules of RF transmitting/receiving system, the duty cycle of oscillatory signal outputted by intermittent oscillation circuit in each of the transmitting modules can be adjusted appropriately, so that the data collision is decreased while each of the transmitting modules performs data transmission simultaneously, and moreover, the power consumption is decreased.

Figure 6:
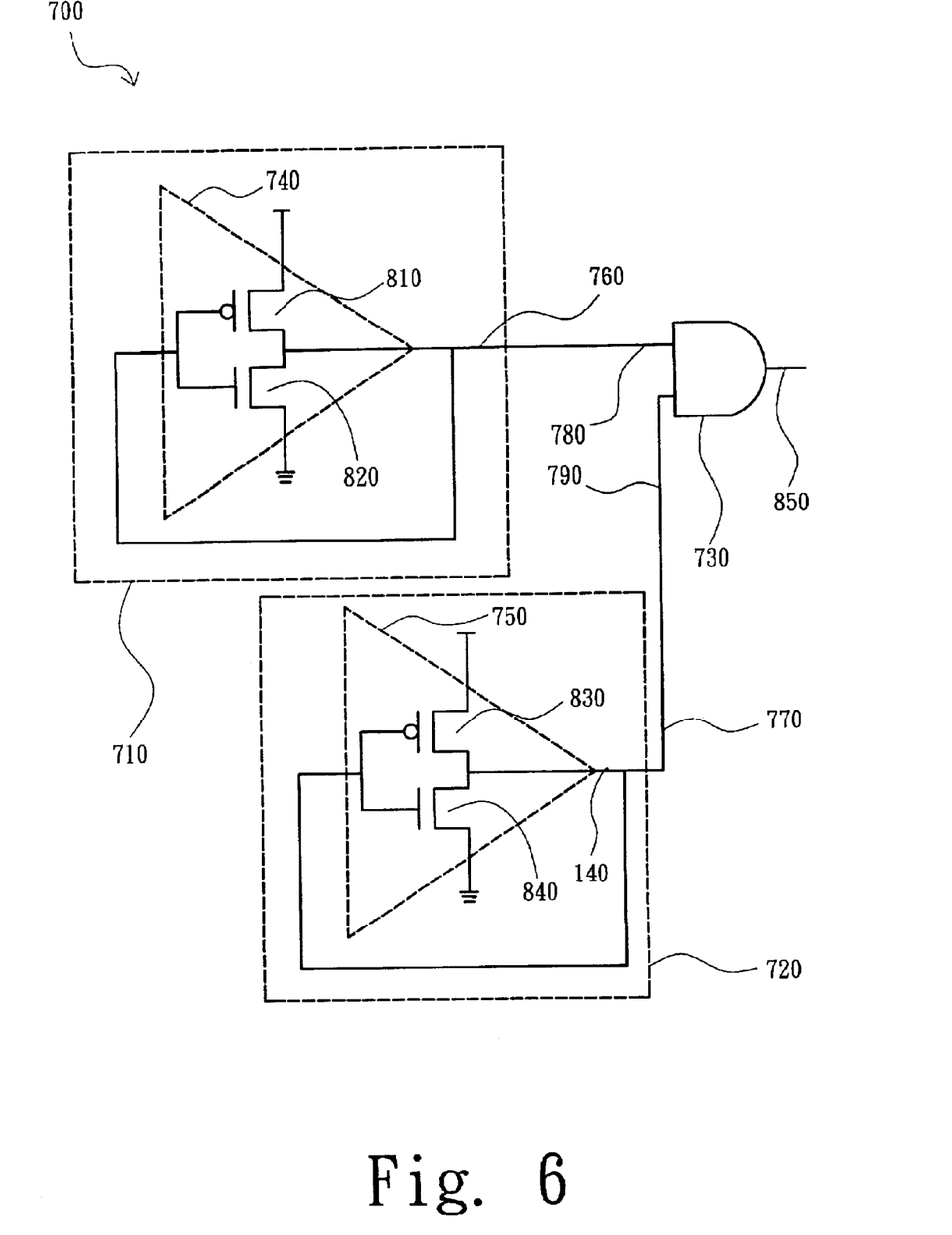
FIG. 6 is a circuit diagram showing the other embodiment of the present invention.

Furthermore, please referring to FIG. 6, FIG. 6 is a circuit diagram showing the other embodiment of the present invention. The oscillation circuit 700 shown in FIG. 6 is constructed by an inversion circuit 710, an inversion circuit 720 and an "AND" logic gate 730. Similarly, the inversion circuit 710 is constructed by an inverter 740, and the inversion circuit 720 is constructed by an inverter 750. Such as shown in FIG. 6, the inverter 740 is constructed by a PMOS 810 and a NMOS 820, and the inverter 750 is constructed by a PMOS 830 and a NMOS 840. The output terminal 760 of the inversion circuit 710 and the output terminal 770 of the inversion circuit 720 are electrically connected to the input terminal 780 and the input terminal 790 of the "AND" logic gate 730 respectively, so that the oscillatory signal outputted from the inversion circuit 710 and the oscillatory signal outputted from the inversion circuit 720 are performed with a logic process in the "AND" logic gate 730. It means that an oscillatory signal with a high voltage level is outputted from the output terminal of the "AND" logic gate 730 if the oscillatory signal outputted from the inversion circuit 710 and that outputted from the inversion circuit 720 both are the same as the high voltage level simultaneously. Otherwise, an oscillatory signal with a low voltage level is outputted from the output terminal of the "AND" logic gate 730 if either of the oscillatory signal outputted from the inversion circuit 710 and that outputted from the inversion circuit 720 is low voltage level simultaneously. Therefore, through assigning one of the inversion circuits 710 and 720 as a main oscillation circuit, and assigning the other one as a control circuit, the oscillation circuit 700 can output an oscillatory signal with different duty cycle by adjusting the oscillatory signal outputted from the control circuit.

The advantage of the present invention is to provide an intermittent oscillation circuit utilized in a RF transmitting/receiving system. In the intermittent oscillation circuit of the present invention, a power control circuit constructed by a comparing module and a PMOS is utilized to control the operation voltage level outputted from the power supply circuit, so that the duty cycle of oscillatory signal outputted from the intermittent oscillation circuit can be adjusted. While numerous transmitting modules perform data transmission simultaneously, the data collision is thus decreased, and the power consumption at data transmitting/receiving terminal is decreased as well.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An intermittent oscillation circuit, which is utilized in a RF transmitting/receiving system, the intermittent oscillation circuit comprising:
   a power supply circuit;
   a power control circuit, comprising:
      a first resistor, wherein one terminal of the first resistor is electrically connected to an output terminal of the power supply circuit;
      a MOS, wherein a drain of the MOS is electrically connected to the other terminal of the first resistor, and a source terminal of the MOS is electrically connected to a ground; and
      a comparing module, wherein an output terminal of the comparing module is electrically connected to a gate of the MOS;
   an inversion circuit, comprising:
      a second resistor;
      a third resistor;
      a fourth resistor, wherein one terminal of the fourth resistor, one terminal of the third resistor and one terminal of the second resistor all are electrically connected to an input terminal of the comparing module;
      a first capacitor, wherein one terminal of the first capacitor is electrically connected to the ground;
      a second capacitor, wherein one terminal of the capacitor is electrically connected to the ground, and the other terminal of the capacitor is electrically connected to the other terminal of the third resistor; and
      at least one inverter, wherein an operation voltage terminal of the at least one inverter is electrically connected to the output terminal of the power supply circuit, and an input terminal of the at least one inverter is electrically connected to the other terminal of the first capacitor and the other terminal of the fourth resistor, and an output terminal of the inverter is electrically connected to the other terminal of the second resistor and is used as an output terminal of the intermittent oscillation circuit.

2. The intermittent oscillation circuit of claim 1, wherein the at least one inverter is constructed by a PMOS and a NMOS, and a source of the NMOS is electrically connected to the ground, and a drain of the PMOS is electrically connected to the output terminal of the power supply circuit, and a gate of the PMOS and a gate of the NMOS both are electrically connected to the other terminal of the first capacitor and the other terminal of the fourth resistor, and a source of the PMOS and a drain of the NMOS both are electrically connected to the other terminal of the second resistor and are used as the output terminal of the intermittent oscillation circuit.

3. The intermittent oscillation circuit of claim 1, wherein the capacitance of the second capacitor is much larger than the capacitance of the first capacitor.

4. The intermittent oscillation circuit of claim 1, wherein the power supply circuit comprises:
   a current source, wherein one terminal of the current source is electrically connected to the ground; and
   a fifth resistor, wherein one terminal of the fifth resistor is electrically connected to the ground, and the other terminal of the fifth resistor and the other terminal of the current source both are electrically connected and are used as the output terminal of the power supply circuit.

5. The intermittent oscillation circuit of claim 1, wherein the power supply circuit is a voltage source.

6. The intermittent oscillation circuit of claim 1, wherein the MOS is a PMOS.

7. An intermittent oscillation circuit, which is utilized in a RF transmitting/receiving system, the intermittent oscillation circuit comprising:
   a power supply circuit, comprising:
      a current source, wherein one terminal of the current source is electrically connected to a ground; and
      a first resistor, wherein one terminal of the first resistor is electrically connected to the ground, and the other terminal of the first resistor and the other terminal of the current source both are electrically connected and are used as an output terminal of the power supply circuit;
   a power control circuit, comprising:
      a second resistor, wherein one terminal of the second resistor is electrically connected to the output terminal of the power supply circuit;
      a first PMOS, wherein a drain of the first PMOS is electrically connected to the other terminal of the second resistor, and a source terminal of the first PMOS is electrically connected to the ground; and
      a comparing module, wherein an output terminal of the comparing module is electrically connected to a gate of the first PMOS;

an inversion circuit, comprising:
- a third resistor;
- a fourth resistor;
- a fifth resistor, wherein one terminal of the fifth resistor, one terminal of the fourth resistor and one terminal of the third resistor all are electrically connected to an input terminal of the comparing module;
- a first capacitor, wherein one terminal of the first capacitor is electrically connected to the ground;
- a second capacitor, wherein one terminal of the second capacitor is electrically connected to the ground, and the other terminal of the second capacitor is electrically connected to the other terminal of the fourth resistor; and
- at least one inverter, wherein the at least one inverter is constructed by a second PMOS and a NMOS, and a source of the NMOS is electrically connected to the ground, and a drain of the second PMOS is electrically connected to the output terminal of the power supply circuit, and a gate of the second PMOS and a gate of the NMOS both are electrically connected to the other terminal of the first capacitor and the other terminal of the fifth resistor, and a source of the second PMOS and a drain of the NMOS both are electrically connected to the other terminal of the third resistor and are used as the output terminal of the intermittent oscillation circuit.

* * * * *